United States Patent
Huang

(10) Patent No.: US 8,203,363 B2
(45) Date of Patent: Jun. 19, 2012

(54) FREQUENCY DETECTION APPARATUS AND METHOD

(75) Inventor: Chen-Chih Huang, HsinChu (TW)

(73) Assignee: Realtek Semiconductor Corp., Hsinchu (TW)

( * ) Notice: Subject to any disclaimer, the term of this patent is extended or adjusted under 35 U.S.C. 154(b) by 0 days.

(21) Appl. No.: 12/712,806

(22) Filed: Feb. 25, 2010

(65) Prior Publication Data

US 2010/0219865 A1  Sep. 2, 2010

(30) Foreign Application Priority Data

Feb. 27, 2009  (TW) ............................... 98106321 A

(51) Int. Cl.
  *G01R 23/02* (2006.01)
(52) U.S. Cl. .......... 327/47; 327/39; 327/102; 324/76.39
(58) Field of Classification Search .................... 327/39,
  327/47, 49, 102; 324/76.39, 76.41, 76.47,
  324/76.52, 76.53, 76.55, 76.66, 76.69, 76.74
  See application file for complete search history.

(56) References Cited

U.S. PATENT DOCUMENTS

| | | | | | |
|---|---|---|---|---|---|
| 4,367,558 | A | * | 1/1983 | Gercekci et al. | 455/164.2 |
| 6,081,137 | A | * | 6/2000 | Choi | 327/43 |
| 2001/0048299 | A1 | * | 12/2001 | Farjad-Rad | 324/76.52 |
| 2002/0017926 | A1 | * | 2/2002 | Saito | 327/39 |
| 2008/0186055 | A1 | | 8/2008 | Chen et al. | |
| 2010/0052732 | A1 | * | 3/2010 | Tokano | 327/47 |

FOREIGN PATENT DOCUMENTS

CN  1549449  11/2004

OTHER PUBLICATIONS

Office Action mailed Jun. 23, 2011 for serial No. CN 200910118278.8.
Abstract of CN1549449.

* cited by examiner

*Primary Examiner* — Patrick O'Neill
(74) *Attorney, Agent, or Firm* — Thomas, Kayden, Horstemeyer & Risley, LLP

(57) ABSTRACT

A frequency detection apparatus and method are provided. The frequency detection apparatus includes a frequency conversion circuit and an analog conversion circuit. The frequency conversion circuit receives an input clock, and generates an analog signal corresponding to a frequency of the input clock based on the frequency of the input clock. The analog conversion circuit is coupled to the frequency conversion circuit, receives the analog signal, and generates a discriminating signal corresponding to the frequency of the input clock based on the analog signal, where the discriminating signal represents a frequency interval of the input clock.

13 Claims, 3 Drawing Sheets

FREQUENCY DETECTION APPARATUS AND METHOD

CROSS-REFERENCES TO RELATED APPLICATIONS

This non-provisional application claims priority under 35 U.S.C. §119(a) on Patent Application No. 98106321 filed in Taiwan, R.O.C. on 2009 Feb. 27, the entire contents of which are hereby incorporated by reference.

BACKGROUND

1. Technical Field

The disclosure relates to an electronic circuit, and more particularly to a frequency detection circuit.

2. Related Art

In applications, an integrated circuit (IC) sometimes needs different input reference frequencies, and then completes the application of subsequent circuits through the input reference frequencies. For example, a phase lock loop (PLL) realizes the technology of frequency and phase synchronization by receiving a reference frequency based on feedback control principles.

The PLL receives an external reference frequency, and keeps a circuit frequency output synchronous with the reference frequency. When the reference frequency or a phase changes, the PLL may detect the change and adjust the output frequency by means of the internal feedback control until the output frequency is again synchronous with the reference frequency. Additionally, in actual applications of the PLL the input end may be coupled to different reference clocks (or oscillating crystals), such as 14.318 MHz or 25 MHz. Different reference frequencies are thus generated and input to the PLL.

For many reasons, the same IC may need to be coupled to different reference clock oscillations in order to receive a plurality of different reference frequencies. Two examples are now described. In the first example a specific IC uses a 25 MHz oscillating crystal to provide a desired reference frequency; if the 25 MHz oscillating crystal is out of stock, a 48 MHz oscillating crystal can at present be used to provide the reference frequency, which can achieve the same efficacy as the 25 MHz oscillating crystal in combination with the frequency dividing action. In the second example a specific IC has a built-in 25 MHz oscillation circuit; it is assumed that, after the IC is connected to a printed circuit board (PCB), since the PCB has a 48 MHz reference frequency the 48 MHz of the motherboard can be directly used as an input frequency, and frequency dividing can then be used to reduce the external elements (such as oscillating crystals and capacitors), as required by the 25 MHz oscillation circuit.

The previous description demonstrates that the conventional IC requires many extra pins as a selection mechanism, so that a plurality of reference frequencies provided from an external source may function normally. Assuming that the reference frequency output from the outside may be 25 MHz or 48 MHz, an extra pin must be used, and different signals are transferred to the pin to inform the IC of which reference frequency is to be used at this time. For example, when the received signal is "1", the 25 MHz frequency is selected and when the received signal is "0", the 48 MHz frequency is selected. However, in the prior art the more reference frequencies are required, the more pins are needed. For example, when five different reference frequencies to select are required, three extra pins are needed. Since electronic products are designed for minimal size, the space required for even one pin is at a premium. Eventually, there is no space for the extra pins.

SUMMARY

Accordingly, the disclosure is directed to a frequency detection apparatus and method. By means of the apparatus or method of the disclosure, an input frequency can be determined automatically without adding extra pins, so that a back-end circuit can match the currently received input frequency so as to utilize the frequency. The result is that considerable space for disposing the pins is saved, which is more consistent with the aim of developing electronic products for minimal size.

The disclosure provides a frequency detection apparatus, which includes a frequency conversion circuit and an analog conversion circuit. The frequency conversion circuit receives an input clock, and generates an analog signal corresponding to a frequency of the input clock based on the frequency of the input clock. The analog conversion circuit is coupled to the frequency conversion circuit, receives the analog signal, and generates a discriminating signal corresponding to the frequency of the input clock based on the analog signal, where the discriminating signal represents a frequency interval of the input clock.

The disclosure further provides a frequency detection method which is applicable to adjusting a frequency dividing operation of a circuit, and includes the following steps. An input clock is received, where the input clock has a frequency. An analog signal is generated based on the frequency of the input clock. A scope of the analog signal is determined to generate a discriminating signal, where the discriminating signal represents a frequency interval of the input clock.

Preferred embodiments and effects of the disclosure are illustrated below with reference to the accompanying drawings.

BRIEF DESCRIPTION OF THE DRAWINGS

The disclosure will become more fully understood from the detailed description given herein below for illustration only, and thus not limitative of the disclosure, wherein.

DETAILED DESCRIPTION

Figure 1:
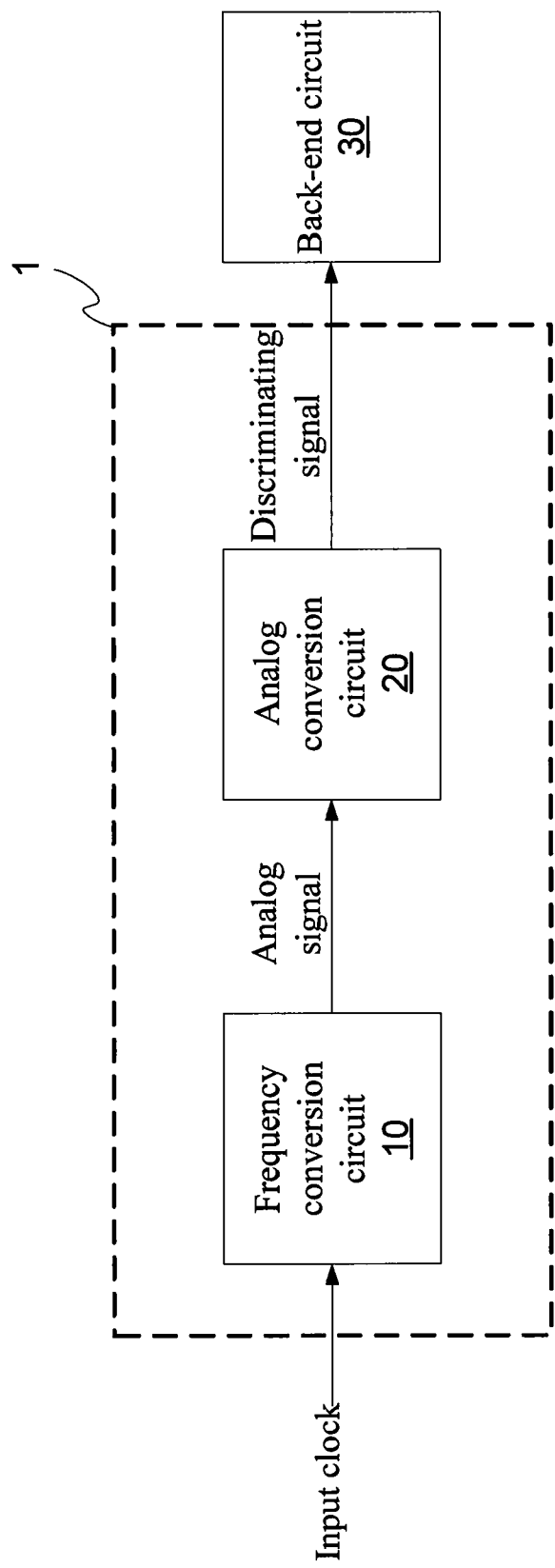
FIG. 1 is a schematic view of an embodiment of a frequency detection apparatus.

FIG. 1 is a schematic view of an embodiment of a frequency detection apparatus. A frequency detection apparatus 1 according to the embodiment is coupled to a back-end circuit 30, and the frequency detection apparatus 1 includes a frequency conversion circuit 10 and an analog conversion circuit 20.

The frequency conversion circuit 10 receives an input clock, and the input clock herein may be a reference clock generated by an oscillating crystal. The frequency detection apparatus 1 according to the embodiment can discriminate a frequency range (frequency interval) of the input clock. In an embodiment, the frequency conversion circuit 10 receives the input clock, where a frequency of the input clock is an unknown frequency. The frequency conversion circuit 10 is charged according to the input clock in order to generate an analog signal corresponding to the input clock. A voltage of the analog signal corresponds to the frequency of the input clock.

The analog conversion circuit 20 is coupled to the frequency conversion circuit 10, and discriminates a voltage range of the analog signal after receiving the analog signal in order to generate a discriminating signal corresponding to the frequency of the input clock, and transfers the discriminating signal to the back-end circuit 30. When receiving the discriminating signal generated by the analog conversion circuit 20, the back-end circuit 30 adjusts a corresponding circuit of the back-end circuit 30 in order to execute a required subsequent action according to the discriminating signal. That is, on the basis of the frequency value or the frequency scope of the input clock represented by the discriminating signal, the back-end circuit 30 executes a subsequent action required by the corresponding input clock based on the discriminating signal.

In an embodiment, the analog conversion circuit 20 may be an ADC or a SLICER of various types, or is implemented by means of a circuit composed by a plurality of comparators.

Figure 2:
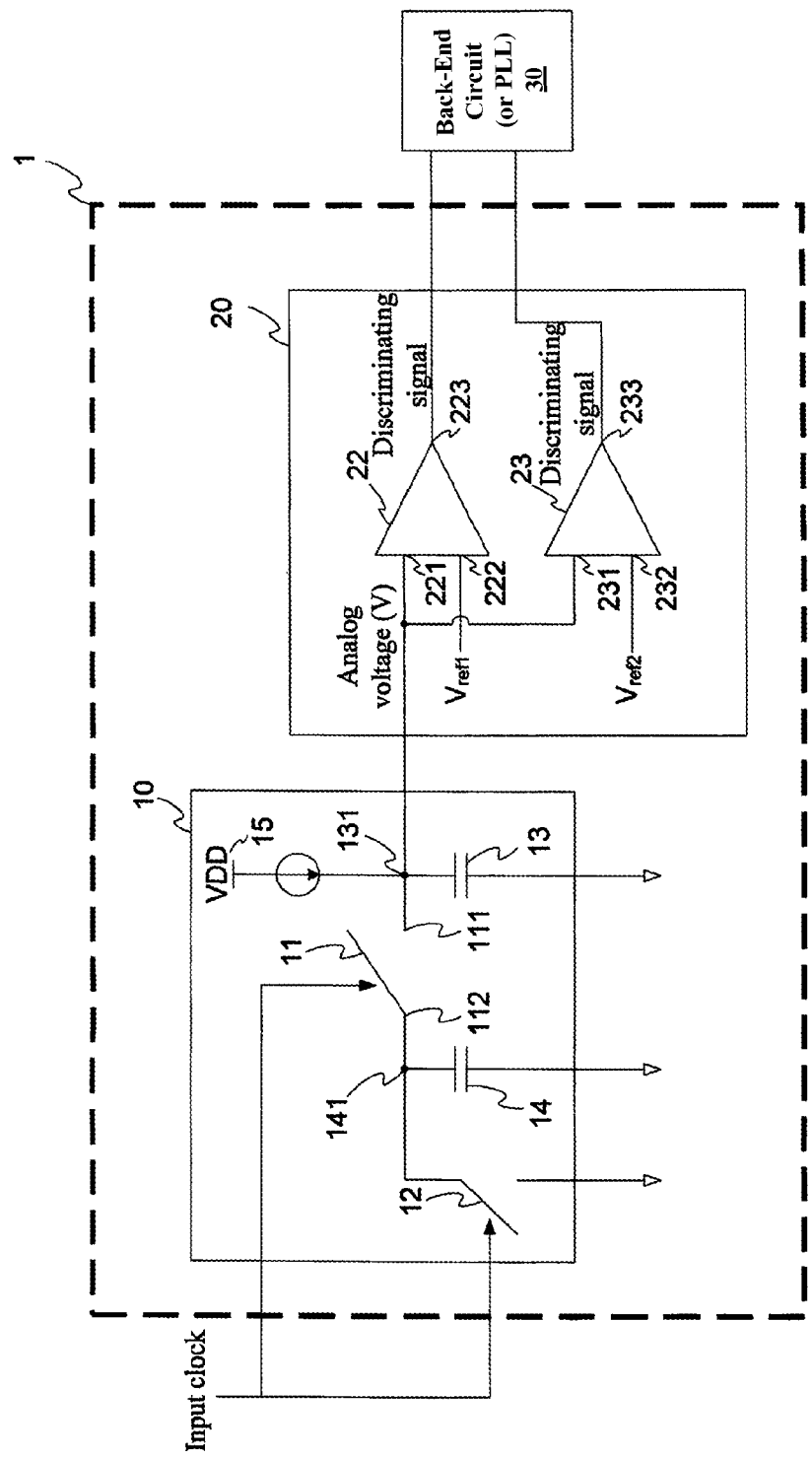
FIG. 2 is a circuit diagram of an embodiment of a frequency detection apparatus.

FIG. 2 is a circuit diagram of an embodiment of a frequency detection apparatus. In this embodiment, an embodiment of the circuit diagram of the frequency conversion circuit 10 and the analog conversion circuit 20 is described.

The frequency conversion circuit 10 in FIG. 2 includes a charge circuit, which includes a first switch 11, a second switch 12, a first capacitor 13, and a second capacitor 14. The first switch 11 has a first end 111 and a second end 112, and is controlled to be turned on or off based on the frequency of the input clock. The first capacitor 13 has a third end 131 coupled to a charge voltage (VDD) 15 and the first end 111 of the first switch 11. The second capacitor 14 has a fourth end 141 coupled to the second end 112 of the first switch 11. A fifth end of the second switch 12 is coupled to the fourth end 141 of the second capacitor 14, and the second switch 12 is controlled to be turned on and turned off based on the frequency of the input clock. The second switch 12 is turned off when the first switch 11 is turned on; conversely, the second switch 12 is turned on when the first switch 11 is turned off. The first switch 11 and the second switch 12 are controlled to be turned on and turned off based on the input frequency (f), so that the first capacitor 13 is charged based on the input frequency. Here, the third end 131 of the first capacitor 13 is an endpoint outputting an analog voltage (V), that is, the voltage output from the first capacitor 13 is the analog voltage (V). It can be known from the above description that the first capacitor 13 is charged based on the input frequency, so the analog voltage (V) is associated with the input frequency (f).

The association between the analog voltage (V) and the input frequency (f) will be illustrated below using mathematical expressions. The second switch 12, the second capacitor (C2) 14, and the first switch 11 in the frequency conversion circuit 10 are considered an equivalent circuit, and an equivalent resistance (R) generated by the equivalent circuit is represented by a mathematic expression $$R = \frac{1}{C2 \times f}.$$

The analog voltage (V) can be determined as $$V = \frac{1}{C2 \times f}$$

using Ohm's law (V=IR) and substituting the equivalent resistance (R). The relationship between the analog voltage (V) and the input frequency (f) can be known from the expression. The unknown input frequency can therefore be determined according to the analog voltage, so as to facilitate the application of the back-end circuit 30.

The circuit in FIG. 2 is only an embodiment, and persons skilled in the art can easily design various different frequency conversion circuits 10 (such as a charge circuit and a discharge circuit), by using different connection relationships between the capacitors and the switches. For example, in an embodiment the frequency conversion circuit 10 is a charge circuit, and an analog voltage output by the charge circuit is in direct proportional to the frequency of the input clock. In other words, the higher the frequency of the input clock, the larger the voltage value of the analog voltage output by the charge circuit will be. In another embodiment the frequency conversion circuit 10 is a discharge circuit, and the discharge circuit discharges on the basis of the frequency of the input clock, so an output analog voltage is in inverse proportional to the frequency of the input clock. In other words, the higher the frequency of the input clock, the lower the voltage value of the analog voltage output by the discharge circuit 10 will be.

In an embodiment, the analog conversion circuit 20 includes at least one comparator. Determination of whether the analog voltage is high or low can be achieved through using a comparator to output the discriminating signal. In FIG. 2, two comparators 22 and 23 are used as an example. However, the number of the comparators can be increased or reduced as required and is not limited thereto. The comparators 22 and 23 have first input ends 221 and 231, second input ends 222 and 232, and output ends 223 and 233 respectively. The first input ends 221 and 231 are coupled to the third end 131 of the first capacitor 13 to receive the analog voltage. The second input ends 222 and 232 receive a reference voltage respectively, compare the analog voltage with the reference voltage respectively to generate a discriminating signal, and output the discriminating signal from the output ends 223 and 233.

For example, the back-end circuit 30 can adjust the circuit in response to different input frequencies, and it is assumed that the input frequencies that can be received are 14.318 MHz, 25 MHz and 48 MHz, in which $V_{ref1}$ is a reference voltage corresponding to a frequency between 14.318 MHz and 25 MHz, ex. 20 MHz. That is, when the input frequency is 20 MHz, the voltage value obtained according to the formula for calculating the analog voltage is theoretically $V_{ref1}$. Likewise, it is assumed that $V_{ref2}$ is a reference voltage corresponding to a frequency between 25 MHz and 48 MHz, ex. 36 MHz. Therefore, after the comparators 22 and 23 receive the analog voltage generated by the frequency conversion circuit 10 based on the input frequency, the interval scope in which the analog voltage falls can be determined by comparing the analog voltages $V_{ref1}$ and $V_{ref2}$ respectively, such that the frequency value of the corresponding input frequency can be obtained, thereby generating a corresponding discriminating signal by the output end 223 or 233 of the comparator 22 or 23 and transferring the discriminating signal to the back-end circuit 30. As such, the back-end circuit 30 can obtain the frequency value of the input frequency according to the discriminating signal, thereby selecting and using the input frequency.

For example, it can be known from the comparison result of the comparators that the analog voltage falls within the interval of the reference voltage ($V_{ref1}$ and $V_{ref2}$) corresponding to 25 MHz. The discriminating signal is thus output from the output end 223 of the comparator 22 and output end 233 of the comparator 23 and transferred to the back-end circuit 30, so that the back-end circuit 30 selects 25 MHz as an input frequency and adjusts the relevant circuit in response to the 25 MHz input frequency.

Furthermore, the analog conversion circuit 20 may convert an analog voltage by means of a lookup table. An analog voltage conversion table may be established, and the analog conversion action is performed by looking up the conversion table, thereby obtaining a digitalized discriminating signal.

As shown in FIG. 2, the back-end circuit 30 may be a PLL. The PLL plays an important part in the electronic circuit, particularly in the communication field. The application scope of the PLL is extensive, such as modulation, demodulation, frequency multiplication, frequency synthesis, carrier synchronization, and bit synchronization, all of which apply the PLL concept and technology. The PLL is a feedback loop, and in this loop a feedback signal is used to lock the frequency and phase of the output signal at the same frequency and phase as that of the input signal. For example, in radio communication, if carrier frequency shift occurs during the transfer of the signal, the PLL may be used at a receiving end so as to enable the oscillation frequency of the receiving end to shift with the frequency, thereby locking the phase.

In actual applications, the PLL may use different input frequencies as the reference frequency. Further, the frequency detection apparatus 1 according to the embodiment can determine automatically the range of the input frequency, thereby generating a discriminating signal to inform the PLL. In this way the PLL can take an appropriate frequency dividing action based on the input frequency at the time, i.e., adjust the divider of the PLL to output the frequency value that is actually required.

Figure 3:
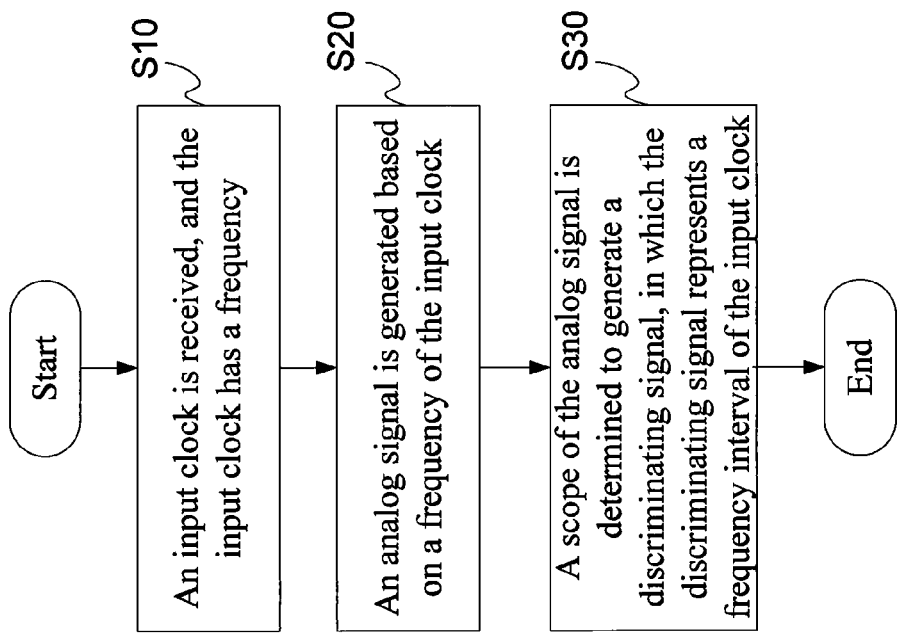
FIG. 3 is a flow chart of a frequency detection method.

FIG. 3 is a flow chart of a frequency detection method. The frequency detection method according to the embodiment is applied to adjusting a frequency dividing operation of a circuit, which includes the following steps.

In step S10, an input clock is received, and the input clock has a frequency.

In step S20, an analog signal is generated based on a frequency of the input clock. In this step, a capacitor is charged or discharged based on the frequency of the input clock to generate the analog signal.

In step S30, a range of the analog signal is determined to generate a discriminating signal, where the discriminating signal represents a frequency interval of the input clock. This step may further include the following: the analog signal is compared with at least one reference voltage to generate the discriminating signal.

The analog signal can be converted by means of a lookup table to generate the discriminating signal.

Additionally, an operation of a circuit can be adjusted based on the discriminating signal generated in step S30. In the case the circuit may be a PLL (FIG. 2), the PLL adjusts the frequency dividing operation of the PLL based on the discriminating signal.

While the disclosure has been described by the way of example and in terms of the preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A frequency detection apparatus, comprising:
   a frequency conversion circuit, for receiving an input clock, and generating an analog signal corresponding to a frequency of the input clock based on the frequency of the input clock;
   an analog conversion circuit, coupled to the frequency conversion circuit, for receiving the analog signal and generating a plurality of discriminating signals, each corresponding to the frequency of the input clock based on the analog signal, wherein each discriminating signal represents a frequency interval of the input clock; and
   wherein the analog conversion circuit comprises a plurality of comparators, each comparator having a first input end, a second input end, and an output end, wherein the first input end receives the analog signal, the second input end receives a reference voltage, each comparator compares the analog signal with the respective reference voltage to generate the one of the discriminating signals, and outputs the discriminating signal from the output end, wherein the reference voltage received by each comparator is a different reference voltage than the reference voltages received by the other comparators.

2. The frequency detection apparatus according to claim 1, wherein the frequency conversion circuit comprises a charge circuit.

3. The frequency detection apparatus according to claim 2, wherein the charge circuit comprises:
   a first switch, having a first end and a second end, wherein the first switch is controlled to be turned on and turned off based on the frequency of the input clock;
   a first capacitor, having a third end, wherein the third end is coupled to a charge voltage and the first end of the first switch;
   a second capacitor, having a fourth end, wherein the fourth end is coupled to the second end of the first switch; and
   a second switch, having a fifth end coupled to the fourth end of the second capacitor, wherein the second switch is controlled to be turned on and turned off based on the frequency of the input clock, the second switch is turned off when the first switch is turned on, and the second switch is turned on when the first switch is turned off.

4. The frequency detection apparatus according to claim 3, wherein the frequency detection apparatus is coupled to a phase lock loop (PLL), and the PLL adjusts frequency dividing of the PLL based on the discriminating signals.

5. The frequency detection apparatus according to claim 2, wherein the frequency detection apparatus is coupled to a phase lock loop (PLL), and the PLL adjusts frequency dividing of the PLL based on the discriminating signals.

6. The frequency detection apparatus according to claim 1, wherein the frequency detection apparatus is coupled to a phase lock loop (PLL), and the PLL adjusts frequency dividing of the PLL based on the discriminating signals.

7. The frequency detection apparatus according to claim 1, wherein frequency detection apparatus is coupled to a back-end circuit, the back-end circuit receives a plurality of clock signals and the discriminating signal and selects one of the plurality of clock signals as an operation clock signal of the back-end circuit according to the discriminating signals.

8. A frequency detection method, comprising:
   receiving an input clock, wherein the input clock has a frequency;

generating an analog signal based on the frequency of the input clock; and determining a range of the analog signal to generate a plurality of discriminating signals by comparing the analog signal with a plurality of distinct reference voltages, wherein each discriminating signal represents a frequency interval of the input clock.

9. The frequency detection method according to claim 8, comprising:

adjusting an operation of a circuit based on the discriminating signals.

10. The frequency detection method according to claim 9, wherein the circuit is a phase lock loop (PLL).

11. The frequency detection method according to claim 10, wherein the PLL adjusts frequency dividing of the PLL based on the discriminating signals.

12. The frequency detection method according to claim 8, wherein the step of generating the analog signal comprises:

charging and discharging a capacitor based on the frequency of the input clock to generate the analog signal.

13. The frequency detection method according to claim 8, further comprising:

receiving a plurality of clock signals, wherein each of the clock signals has a different frequency; and selecting one of the clock signals as an operation clock signal according to the discriminating signals.

* * * * *